United States Patent [19]

Stern

[11] 4,416,052
[45] Nov. 22, 1983

[54] METHOD OF MAKING A THIN-FILM SOLAR CELL

[75] Inventor: Theodore G. Stern, San Diego, Calif.

[73] Assignee: General Dynamics, Convair Division, San Diego, Calif.

[21] Appl. No.: 363,195

[22] Filed: Mar. 29, 1982

[51] Int. Cl.³ .................. H01L 31/06; H01L 31/18
[52] U.S. Cl. .................................. 29/572; 136/256; 136/259; 136/262
[58] Field of Search .................. 29/572; 136/256, 259, 136/262; 156/650–652, 656, 662

[56] References Cited

U.S. PATENT DOCUMENTS

| | | | |
|---|---|---|---|
| 2,794,846 | 6/1957 | Fuller | 136/256 |
| 3,261,074 | 7/1966 | Beauzee | 29/572 |
| 4,338,481 | 7/1982 | Mandelkorn | 136/255 |

Primary Examiner—Aaron Weisstuch
Attorney, Agent, or Firm—John R. Duncan

[57] ABSTRACT

A method of making a thin gallium arsenide solar cell having a reflecting back surface and coplanar electrical contacts. A photovoltaic cell comprising gallium arsenide is produced in a self-supporting thickness by conventional methods. A pattern of contact lines and a bus contact are formed on the front surface of the cell and a transparent coverslide is bonded thereover. The back of the cell is chemically etched away until the minimum effective thickness is reached, then etching in the bus contact region is continued until the bus is exposed. Any stop-etch material used to prevent excessive etching of the cell material is removed and a reflective contact material is applied to the back of the cell. The resulting solar cell is light in weight and both front and back connections can be made from the back of the cell, making it particularly suitable for use in space-based arrays.

7 Claims, 3 Drawing Figures

METHOD OF MAKING A THIN-FILM SOLAR CELL

BACKGROUND OF THE INVENTION

This invention relates in general to photovoltaic cells adapted to absorb photons in a selected bandgap for conversion to electricity and, more specifically, to a method of producing a thin-film, back-surface-reflector coplanar contact solar cell comprising gallium arsenide.

With the continuing increases in the cost and availability of energy has come increased interest in photovoltaic cells useful in solar cell arrays to convert the sun's radiation directly into electricity. A number of problems have, however, limited the usefulness of such direct energy conversion solar cells.

Most of the known photo electric materials have low efficiencies, generally well below 20%. Also, the materials tend to be expensive and the devices difficult and expensive to fabricate in the sizes required to generate appreciable quantities of electricity. Photons in bands outside the absorption bandgap of the specific photo electric material tend to be absorbed in the cell and converted to waste heat which degrades the cell output and must be carried away. Terrestrial solar cell arrays further suffer from a reduction in impinging solar energy due to atmospheric haze, clouds and night time.

Space based arrays have been proposed to overcome these problems, both for use where electrical energy is required in space, e.g., powering a space station, and for retransmission to earth, e.g., through microwave transmitters and receivers. Between the relatively high weight and low efficiency of present solar cell designs and photovoltaic materials, large space based solar cell arrays have not yet become economically feasible.

Thus, there is a continuing need for improvements in the manufacture of solar cells and photovoltaic materials, especially for use in space.

SUMMARY OF THE INVENTION

The above-noted problems, and others, are overcome by a method of manufacturing thin solar cells comprising the steps of forming a self-supporting photovoltaic cell from a photovoltaic material comprising gallium arsenide, forming a contact bus and a pattern of contact lines on the front surface of the cell, bonding a thin, structurally supporting transparent coverslide over the bus and contact lines, initially etching the back surface of the cell to uniformly reduce the thickness to a minimum useful thickness, further etching the back surface in the area of the bus until said bus is exposed, removing any stop-etch material used to limit the area of said further etching and applying a reflective contact material to said back surface of the photovoltaic material.

BRIEF DESCRIPTION OF THE DRAWING

Details of the invention, and of certain preferred embodiments thereof, will be further understood upon reference to the drawing, wherein.

DETAILED DESCRIPTION OF THE INVENTION

Figure 1:
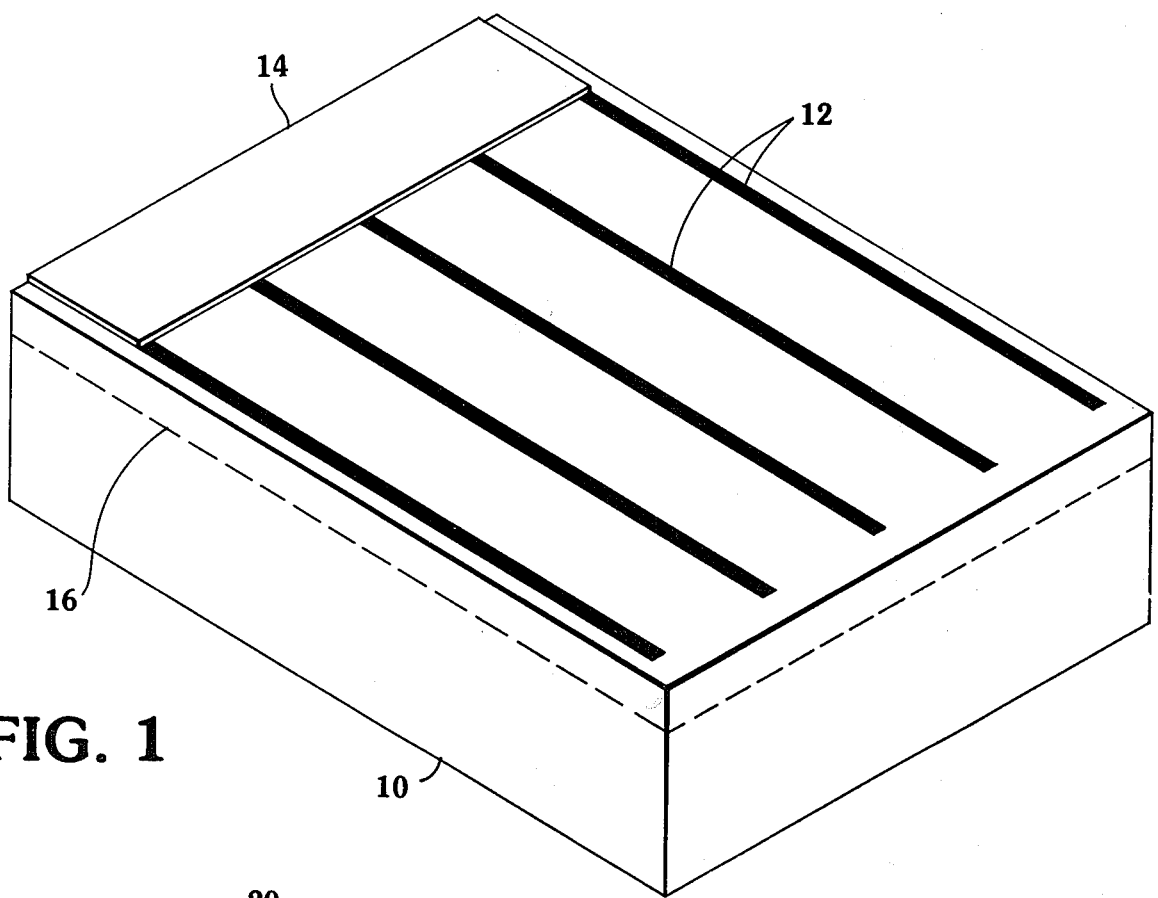
FIG. 1 is a schematic perspective view of a solar cell after formation of the photovoltaic material and application of front contacts.

Referring now to FIG. 1, there is seen a perspective view of a photovoltaic cell 10 as manufactured by conventional processes, as described above. Typically, the cell has a thickness of from about 50 to 300 micrometers.

Any suitable photovoltaic material of the aluminum gallium arsenide antimonide family may be used, with any suitable additives, composition variations, etc. For example if a 1.65 eV bandgap is desired, a 20% Al GaAs photovoltaic material is useful.

The cell 10 may be formed by any suitable process. Typical processes include orgnaometallic chemical vapor deposition, infinite melt epitaxial growth and variations and combinations thereof. Of these, organometallic chemical vapor deposition (also known as organometallic vapor-phase epitaxy) is preferred since it permits the production of the required smooth epitaxial layers with extremely accurate control of both layer dopings and thicknesses. Either p-on-n or n-on-p configurations can be produced as desired.

A pattern of front contacts 12 and a bus contact 14 are formed on the front surface of cell 10.

The front contact lines and bus contact may be formed by any suitable technique from any suitable materials. Typical metallization techniques include thermal evaporation, electron beam evaporation, RF sputtering, ion beam sputtering and combinations thereof. For optimum conductivity, gold is preferred as the primary ingredient in the front contact lines and bus contact. These contact materials may, of course, contain additives to enhance selected physical characteristics.

A normal characteristic of GaAs cells of this type is that the active junction area, schematically illustrated by dotted line 16, is located in a plane parallel to the front surface at a depth of from about 0.1 to 2.0 micrometers. The overall thickness of the cell 10 is a result of the manufacturing process and the necessity that the cell be self-supporting at this stage.

Figure 2:
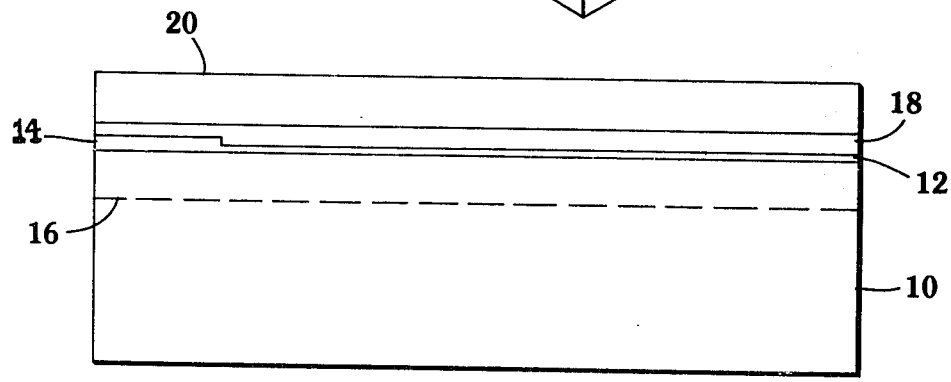
FIG. 2 is a schematic side elevation view of the solar cell of FIG. 1 after application of a coverslide and initial uniform back etching.

The cell of FIG. 1 is shown at the next major stage of fabrication in FIG. 2 in a schematic side elevation view. Thicknesses of the various layers have been exagerated for clarity. An optically transparent adhesive layer 18 has been applied to the front surface of cell 10, over front contacts 12 and bus contact 14. An optically transparent coverslide 20 is then bonded to adhesive 18.

Any suitable material, transparent in the required bands, may be used for the coverslide to provide structural support and protection for the front surface. Thin, strong glass such as 7740 fused silica available from Corning Glass is preferred. The coverslide preferably has a thickness of from about 25 to 100 micrometers and is bonded by any suitable adhesive, such as EPO-TEK 301 available from Epoxy Technology, Inc., Billerica, Mass.

An antireflection coating, (not shown, due to extreme thinness) such as a 30–100 nm layer of $Ta_2O_5$, $MgF_2$ or $Si_3N_4$, is preferably deposited over the front surface of the cell and front contacts prior to bonding the coverslide thereto.

The back surface of cell 10 is then etched away to reduce the cell thickness to about 5 to 25 micrometers.

This allows effective reflection of unused photons by the back surface reflector without absorption by free carriers in the n-type material. While any suitable material removal method may be used, chemical etching is preferred for accuracy and convenience. Etching of the back surface may be stopped at the desired depth by a stop-etch layer incorporated in the photovoltaic layer at the selected depth in the active region but not across the area behind the front bus contact. Alternatively, the photovoltaic material can be simply etched uniformly until the desired depth is reached, then a protective material can be applied over the active area and etching continued, with etching occurring only across the area behind the bus contact.

As seen in FIG. 2, etching of the cell 10 has been completed to the desired depth, but final etching of the area behind the bus contact 14 has not yet been accomplished.

Figure 3:
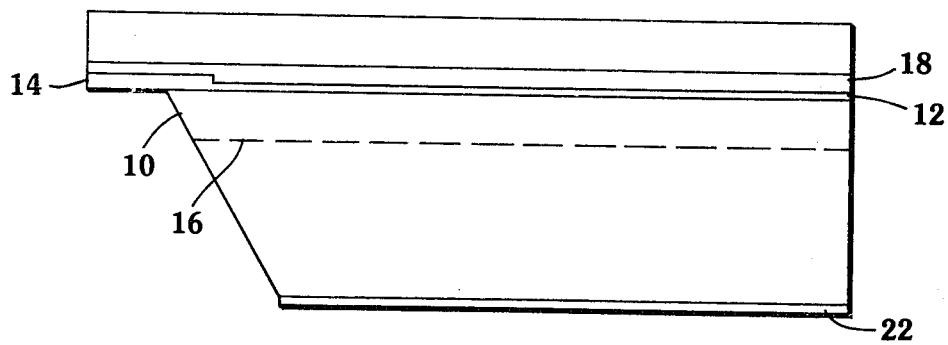
FIG. 3 is a schematic side elevation view of the solar cell of FIG. 2 after final back etching and application of the back contact.

The final solar cell configuration is illustrated in schematic elevation view in FIG. 3, with layer thicknesses exagerated for clarity. Etching of cell 10 has now been completed behind bus contact 14. This permits electrical connections from the back of the cell, reduces cell weight and saves expensive gallium arsenide material for later re-use. A reflective back contact 22 has now been applied. Contact 22 should be both highly conductive and highly reflective. Materials comprising primarily silver have been found to be highly effective for this purpose and are, therefore, preferred. Additives, such as small amounts of tungsten, titanium, tin and gold may be included to improve desired physical properties. Contact 22 may be applied by any conventional method, such as cathode sputtering, or vacuum deposition.

Details of the method of this invention, and certain preferred embodiments thereof, will be further described in the following example. All parts and percentages are by weight unless otherwise indicated.

EXAMPLE I

An aluminum gallium arsenide photovoltaic cell having an area of about 0.177 by 0.125 cm is produced by organometallic vapor-phase epitaxy. These cells have (1) an about 300 micrometers thick back or substrate layer of gallium arsenide, (2) a 1 micrometer thick layer of $Al_{0.9}GaAs$, as an etch stop layer over the surface of the back layer except at the entire area behind the bus contact, (3) a 4 micrometers thick base layer of GaAs doped with sulfur at $7 \times 10^{17}/cm^3$, (4) a 0.5 micrometer thick emitter layer of GaAs doped with zinc at $3 \times 10^{18}/cm^3$ and (5) a 60 nanometers thick $Al_{0.2}GaAs$ window layer. Such a cell is available from Varian Associates (and has a thickness of at least about 250 nanometers). A pattern of 0.5 micrometer thick GaAs lines is formed on the window layer and a pattern of parallel gold grid lines is formed thereover, each about 8 micrometers wide and about 2 micrometers thick, spaced about 135 micrometers apart. A gold bus contact is applied in contact with the front contacts along one edge over an area of about 0.177 by 0.065 cm.

A layer of EPO-TEK 301-2 adhesive is applied over the front surface to a thickness of about 25 micrometers. An about 100 micrometer thick clear glass coverslide is then bonded to the adhesive layer. A 60 nanometers thick $Si_3N_4$ anti-reflection coating is formed on the surface of the cover glass. The back of the cell is then chemically etched with nitric acid until all gallium arsenide is removed behind the bus contact and down to the $Al_{0.9}GaAs$ layer (which acts as an etch stop for substrate removal) behind the active area. The $Al_{0.9}GaAs$ layer is then removed with hydrofluoric acid, which does not attack the $Al_{0.2}GaAs$ layer. A silver back contact is then applied by vacuum deposition and sintering. Tests show that this type cell has nearly 24% efficiency at 200 suns under terrestrial illumination and about 20% efficiency under exoatmospheric illumination. Thus, this solar cell is particularly useful in solar concentrator systems for use in space.

EXAMPLE II

The process described in Example I is repeated, except that in this case the etch-stop layer of $Al_{0.9}GaAs$ is not included. After bonding of the coverslide to the face of the cell, the back of the cell is uniformly chemically etched with nitric acid to a uniform thickness of about 10 micrometers. The back of the cell is then coated with photoresist which is exposed over the entire area except behind the bus contact. Unexposed photoresist is washed away and etching is continued in the bus contact area until the bus contact is exposed. The remaining photoresist is removed and processing is continued as described in Example I. Again, an excellent, very thin, solar cell results.

Certain preferred ingredients, dimensions and arrangements were detailed in the above description of preferred embodiments. These may be varied, where suitable, with similar results. For example, gallium arsenide without the aluminum component, or with other additives or dopants, may be used, as desired. Also, additional anti-reflection coatings on the cell and/or coverslide may be used, if desired, and performance enhancing additives may be used between cell and contacts or in the contact materials as desired.

Other variations, applications and ramifications of this invention will occur to those skilled in the art upon reading this disclosure. These are intended to be included within the scope of this invention as defined in the appended claims.

I claim:

1. A method of forming a thin gallium arsenide solar cell of improved efficiency, which comprises the steps of:
   providing a self-supporting photovoltaic cell comprising gallium arsenide having a thickness of at least about 250 micrometers;
   forming a pattern of contact lines across the front surface of said photovoltaic cell and a bus bar contact along one edge of said front surface;
   bonding a thin visible-light transparent coverslide to said front surface;
   initially etching the back surface of said photovoltaic cell to uniformly reduce the thickness of said photovoltaic cell to a minimum useful thickness;
   applying a stop-etch material to said back surface except in the area corresponding to said bus;
   further etching said back surface down to said bus;
   removing said stop-etch material, and
   applying a light reflective electrically conductive material to the surface protected by said stop-etch.

2. A method of forming a thin gallium arsenide solar cell of improved efficiency, which comprises the steps of:
   providing a self-supporting photovoltaic cell having a thickness of at least about 250 nanometers comprising a substrate layer of $Al_{0.2}GaAs$, a stop-etch layer of $Al_{0.9}GaAs$ extending uniformly over the front surface of said first layer except for an edge area along one edge of said first layer, a layer of GaAs including oppositely doped regions forming a junction therebetween, and a second layer of $Al_{0.2}GaAs$ extending entirely over said stop-etch layer and said edge area;

forming a pattern of contact lines across the outer surface of said second layer and a bus bar contact along one edge of said second layer corresponding to said edge area;

bonding a thin visible-light transparent coverslide to said outer surface;

etching the back surface of said substrate layer up to the stop-etch layer and up to the bus in said edge area not protected by said stop-etch layer;

removing said stop-etch; and applying a light reflective electrically conductive material to the surface previously covered by said stop etch layer.

3. The method according to claim 1 wherein said photovoltaic cell comprises $Al_{0.2}GaAs$.

4. The method according to claim 1 wherein said front surface contact pattern comprises a plurality of substantially parallel lines about 8 microns wide, spaced about 135 microns apart, and connected to a bus bar contact having an area of about 0.177 by 0.065 cm, said pattern and said bus bar comprising gold and having thicknesses of about 2 microns.

5. The method according to claim 1 or 2 wherein said photovoltaic cell is formed by organometallic chemical vapor deposition.

6. The method according to claim 1 or 2 wherein said coverslide has a thickness of from about 25 to 100 microns and said photovoltaic cell has a thickness of from about 5 to 25 microns.

7. The method according to claim 1 or 2 wherein said photovoltaic cell includes a single layer $Si_3N_4$ antireflection coating having a thickness of about 60 nanometers located between the solar cell and coverslide.

* * * * *